United States Patent
Wang et al.

(10) Patent No.: US 11,581,849 B2
(45) Date of Patent: Feb. 14, 2023

(54) MEASUREMENT METHOD OF SUBCELL PHOTOCURRENTS AND THEIR MATCHING DEGREE OF A MULTI-JUNCTION PHOTOVOLTAIC CELL

(71) Applicant: SUZHOU INSTITUTE OF NANO-TECH AND NANO-BIONICS (SINANO), CHINESE ACADEMY OF SCIENCES, Suzhou (CN)

(72) Inventors: Ancheng Wang, Suzhou (CN); Jianrong Dong, Suzhou (CN); Yurun Sun, Suzhou (CN); Shuzhen Yu, Suzhou (CN); Jiajing Yin, Suzhou (CN)

(73) Assignee: SUZHOU INSTITUTE OF NANO-TECH AND NANO-BIONICS (SINANO), CHINESE ACADEMY OF SCIENCES, Suzhou (CN)

( * ) Notice: Subject to any disclaimer, the term of this patent is extended or adjusted under 35 U.S.C. 154(b) by 0 days.

(21) Appl. No.: 17/594,306

(22) PCT Filed: May 28, 2021

(86) PCT No.: PCT/CN2021/096753
§ 371 (c)(1),
(2) Date: Oct. 11, 2021

(87) PCT Pub. No.: WO2022/041894
PCT Pub. Date: Mar. 3, 2022

(65) Prior Publication Data
US 2022/0311381 A1    Sep. 29, 2022

(30) Foreign Application Priority Data
Aug. 31, 2020    (CN) .......................... 202010894576.2

(51) Int. Cl.
*H02S 50/10*    (2014.01)
*H01L 31/0687*    (2012.01)

(52) U.S. Cl.
CPC .......... *H02S 50/10* (2014.12); *H01L 31/0687* (2013.01)

(58) Field of Classification Search
CPC ...... Y02E 10/50; H02S 50/10; H01L 31/0687
See application file for complete search history.

(56) References Cited

U.S. PATENT DOCUMENTS

| | | | |
|---|---|---|---|
| 2011/0068817 A1* | 3/2011 | Hashimoto | ....... H01L 31/02021 |
| | | | 136/252 |
| 2012/0053867 A1* | 3/2012 | Dunn | ...................... H02S 50/10 |
| | | | 702/58 |

(Continued)

FOREIGN PATENT DOCUMENTS

| CN | 106230379 A | 12/2016 | |
|---|---|---|---|
| CN | 106998190 A * | 8/2017 | ............. H02S 50/10 |

(Continued)

*Primary Examiner* — Huy Q Phan
*Assistant Examiner* — Adam S Clarke
(74) *Attorney, Agent, or Firm* — Bayramoglu Law Offices LLC

(57) ABSTRACT

A measurement method of subcell photocurrents and a matching degree of the subcell photocurrents of a multi-junction photovoltaic cell is provided. The measurement method includes measuring an I-V characteristic of the multi-junction photovoltaic cell; and measuring currents corresponding to respective current steps in an I-V curve to obtain approximate values of short-circuit currents of subcells in the multi-junction photovoltaic cell, and then calculating a mismatching degree of the multi-junction photovoltaic cell using step currents. According to the measurement method, a current mismatching degree of the multi-junction photovoltaic cell is obtained by calculating the mismatching degree of the step currents occurring in the (Continued)

I-V curve. The measurement method is rapid and simple, the measurement method avoids complicated and time-consuming processes where the subcell photocurrents are calculated based on a standard light source spectrum integral with bias lights applied.

12 Claims, 1 Drawing Sheet

(56) References Cited

U.S. PATENT DOCUMENTS

| | | | |
|---|---|---|---|
| 2014/0333319 | A1 | 11/2014 | Sinton et al. |
| 2018/0309404 | A1* | 10/2018 | Hare ................... F21S 8/006 |
| 2020/0058819 | A1* | 2/2020 | Kirner ............. H01L 31/022466 |

FOREIGN PATENT DOCUMENTS

| | | |
|---|---|---|
| CN | 111010087 A | 4/2020 |
| CN | 111262526 A | 6/2020 |
| CN | 111555714 A | 8/2020 |

* cited by examiner

MEASUREMENT METHOD OF SUBCELL PHOTOCURRENTS AND THEIR MATCHING DEGREE OF A MULTI-JUNCTION PHOTOVOLTAIC CELL

CROSS REFERENCE TO RELATED APPLICATIONS

This application is the national stage entry of International Application No. PCT/CN2021/096753, filed on May 28, 2021, which is based upon and claims priority to Chinese Patent Application No. 202010894576.2 filed on Aug. 31, 2020, the entire contents of which are incorporated herein by reference.

TECHNICAL FIELD

The present application particularly relates to a measurement method of the subcell photocurrents and their matching degree of a multi-junction photovoltaic cell, belonging to the technical field of semiconductor testing.

BACKGROUND

Multi-junction lamination is an effective manner to boost the voltage of a solar cell or a laser photovoltaic cell. The outstanding performance of the multi-junction photovoltaic cell in the aspect of conversion efficiency have drawn attentions from researchers. The photocurrent of the multi-junction cell is mainly determined by the smallest subcell photocurrent. If it is desired to obtain a cell having high conversion efficiency, it is ensured that the photocurrents of all subcells are equal, namely current matched. Under the requirement that the photocurrents are matched, the thicknesses of subcells are determined by the light fluxes absorbed by the material. However, the structure of the manufactured photovoltaic cell difficultly ensures that the photocurrents of subcells are precisely matched, and therefore inspecting whether the subcell photocurrents of the manufactured multi-junction photovoltaic cell are matched is extremely important in terms of testing and analyzing the multi-junction photovoltaic cell.

In the prior art, whether the subcell photocurrents of the photovoltaic cell are mainly matched is judged by measuring the External Quantum Efficiencies (EQEs) or Spectrum Responses (SRs) of the cell; however, for a multi-junction solar cell, it is needed to apply bias laser so that the photocurrent of the subcell not being tested is in a super-saturation state, and the effect of the subcell not being tested on the subcell being tested is eliminated. If it is desired to obtain the subcell photocurrents of a multi-junction solar cell, it is necessary to successively apply different bias lasers based on the number of subcells to measure the SRs and then calculate the short-circuit currents of subcells in combination with standard spectrum integral. The process of measuring the current matching degree of the multi-junction solar cell is relatively complicated and time-consuming. For the multi-junction laser photovoltaic cell, by comparing the deviation between the wavelength at the maximum SR value and the target wavelength, whether the cell reaches the maximum efficiency at a target wavelength is judged, but the subcell photocurrents of the multi-junction laser photovoltaic cell at a certain wavelength cannot be quantitatively determined. Since the subcells in the multi-junction laser photovoltaic cell are made of the same material, information on the current matching degree of subcells cannot be acquired by using a method that bias light is applied to measure the SR. Moreover, there are currently no good methods for inspecting the current matching degree of the multi-junction laser photovoltaic cell at a certain wavelength.

SUMMARY

The main objective of the present application is to provide a measurement method of subcell photocurrents and their matching degree of a multi-junction photovoltaic cell in order to overcome the defects in the prior art.

In order to achieve the objective of the disclosure, the technical solution adopted by the present application is as follows:

An embodiment of the present application provides a measurement method of subcell photocurrents and their matching degree of a multi-junction photovoltaic cell, comprising:

measuring the I-V characteristics of the multi-junction photovoltaic cell; and measuring currents corresponding to the respective current steps in the I-V curve to obtain the approximate values of subcell photocurrents in the multi-junction photovoltaic cell, and then calculating the current mismatching degree of the multi-junction photovoltaic cell.

Compared with the prior art, the present application has the advantages that according to the measurement method provided by the embodiment of the present application, the I-V curve of the multi-junction photovoltaic cell is measured from a reverse bias voltage to a forward bias voltage or from the forward bias voltage to the reverse bias voltage. The photocurrents of subcells are obtained by measuring the step currents occurring in the I-V curve, and the current mismatching degree of the multi-junction photovoltaic cell is calculated using the subcell photocurrents; and the measurement method provided by the embodiment of the present application is rapid and simple, which avoids the complicated and time-consuming processes where the subcell photocurrents are calculated based on the standard light source spectrum integral with bias lights applied.

DETAILED DESCRIPTION OF THE EMBODIMENTS

Figure 1:
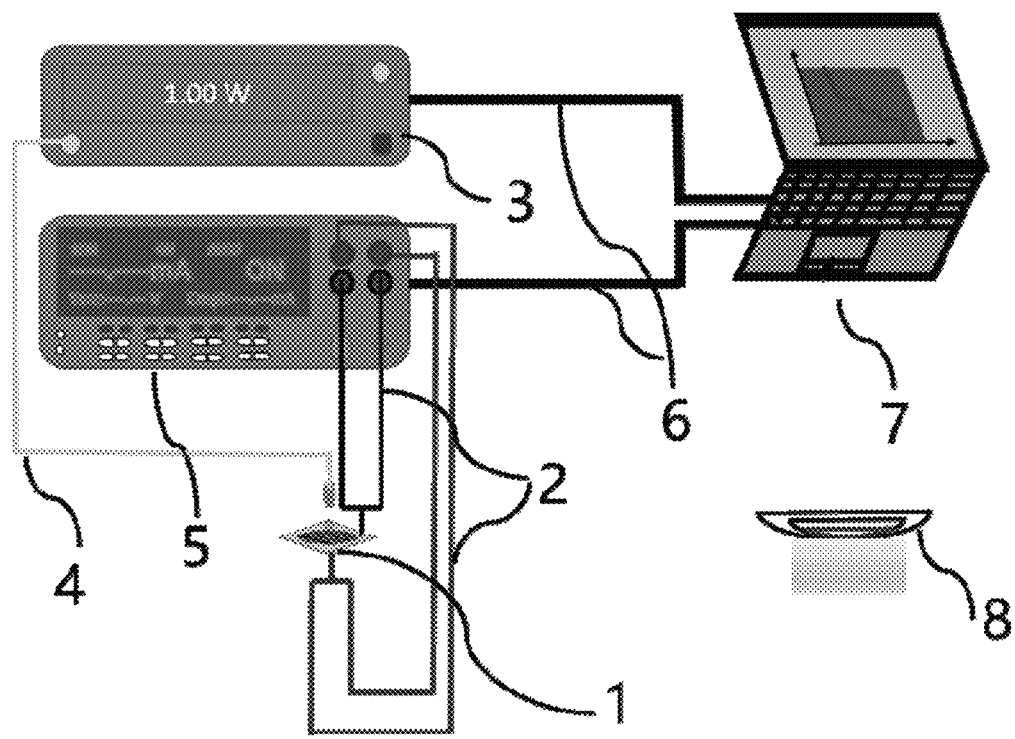
FIG. 1 is a structural diagram of an inspection system for subcell photocurrents and their matching degree of a multi-junction photovoltaic cell provided by a typical embodiment of the present application.

In view of the defects in the prior art, the inventors of this case have performed long-term researches and lots of practices to propose the technical solution of the present application. Next, the technical solution, its implementation process and principle will be further explained and described.

The measurement method of the subcell photocurrents and their matching degree of the multi-junction photovoltaic cell provided by the present application can provide the approximate values of the subcell photocurrents (the short-circuit current is a current when the voltage is 0 V, ideally, it is generally believed that the short-circuit current of a subcell is equal to the photocurrent of the subcell); for the multi-junction laser photovoltaic cell, the reverse breakdown voltages of subcells are determined by their doping concentrations as the bandgap of the subcell is consistent; if the doping concentrations at the light doping side of the PN junction of subcells are different, the short-circuit current of the subcell having a lower doping concentration corresponds to the current of a wider step in the curve, and the short-circuit current of the subcell having a higher doping concentration corresponds to the current of a narrower step in the curve; if the dopings of subcells are the same, the corresponding relationship between the subcells and the current steps in the I-V curve cannot be clarified, but one group of subcell short-circuit current values can also be quantitatively obtained. For the multi-junction solar cell or the multi-junction laser photovoltaic cell, the present application can give the matching degree of the subcell photocurrents through measuring the subcell photocurrents instead of analyzing the current match of subcells through indirect means such as External Quantum Efficiency (EQE).

The present application discloses a measurement method of the subcell photocurrents and their matching degree of a multi-junction photovoltaic cell. The detection tool adopted in the measurement method includes a high-precise source meter, a power-stable light source (a solar simulator for the multi-junction solar cell, and a power-tunable laser for the laser photovoltaic cell) and a photovoltaic cell I-V test system. The measurement method comprises the steps of connecting the multi-junction photovoltaic cell with the high-precise source meter using the four-wire method, irradiating the multi-junction photovoltaic cell using the light source, measuring the I-V curve from the reverse bias voltage to the forward bias voltage or from the forward bias voltage to the reverse bias voltage, measuring current values corresponding to all the steps occurring in the I-V curve, and calculating the current mismatching degree of the multi-junction photovoltaic cell.

An embodiment of the present application provides a measurement method of the subcell photocurrents and their matching degree of a multi-junction photovoltaic cell, comprising:

measuring the I-V characteristic of the multi-junction photovoltaic cell; and measuring the currents corresponding to respective current steps in the I-V curve to obtain the approximate values of short-circuit currents, i.e., photocurrents, of subcells in the multi-junction photovoltaic cell, and then calculating the mismatching degree using the obtained subcell photocurrents for the multi-junction photovoltaic cell.

Further, the measurement method comprises: irradiating the multi-junction photovoltaic cell using a light source having stable output power and meanwhile scanning the multi-junction photovoltaic cell within a set voltage scanning range to obtain the I-V curve.

Further, the set voltage scanning range is from a reverse bias voltage to a forward bias voltage.

Further, the set voltage scanning range is from a reverse breakdown voltage to a forward open-circuit voltage of the photovoltaic cell.

Further, the set voltage scanning range can also be from the forward bias voltage to the reverse bias voltage.

Further, the set voltage scanning range can also be from the forward open-circuit voltage to the reverse breakdown voltage of the photovoltaic cell.

Further, the measurement method specifically comprises:

connecting positive and negative electrodes of a multi junction photovoltaic cell with a high-precise source meter using the four-wire method;

placing the multi-junction photovoltaic cell within the coverage of the light spot; and setting and turning on the light source and meanwhile scanning the multi-junction photovoltaic cell from a reverse bias voltage to a forward bias voltage to obtain the I-V curve.

Further, the multi-junction photovoltaic cell can be an N-junction laser photovoltaic cell, an N-junction solar cell or an N-junction thermal photovoltaic cell, where N≥2.

Further, the multi-junction photovoltaic cell is a laser photovoltaic cell whose light source is a laser having stable output power.

Further, the multi-junction photovoltaic cell is a multi-junction solar cell whose light source is a steady solar simulator.

Further, the measurement method specifically comprises:

measuring the current steps in the I-V curve to obtain current values $I_1, I_2, I_3 \ldots I_N$ corresponding to the current steps, respectively, wherein N is the number of junctions of the multi-junction photovoltaic cell, and the current values corresponding to the current steps are approximately equal to the short-circuit current values of subcells; and calculating the mismatching degree M of this group of currents utilizing Formula (1), namely:

$$M = \frac{\sqrt{\frac{1}{N}\sum_{i=1}^{N}(I_i - \bar{I})^2}}{\bar{I}} \quad \text{Formula (1)}$$

wherein $$\bar{I} = \frac{1}{N}\sum_{i=1}^{N} I_i,$$

thereby obtaining the current mismatching degree of the multi-junction photovoltaic cell, wherein the smaller the M value is, the smaller the current mismatch of the subcells is, conversely, the larger the current mismatch of the subcells is.

Further, the wavelength of the incident light can be the same as or different from the target wavelength of the multi-junction photovoltaic cell.

Next, the technical solution, its implementation process and principle will be further described in detail in conjunction with the accompanying figures.

As shown in FIG. 1, a detection system of the current matching degree of a multi-junction photovoltaic cell is assembled, comprising: a light source 3/8, a high-precise digital source meter 5 and a computer 7, wherein the light source 3/8 is at least used for irradiating the multi-junction photovoltaic cell 1, the high-precise digital source meter 5 is connected with the multi-junction photovoltaic cell 1 to be detected and at least used for measuring and collecting I-V data obtained when the detected multi-junction photovoltaic cell is irradiated by the light source 3/8; the computer 7 is respectively connected with the light source 3/8 and the high-precise digital source meter 5 and at least used for drawing an I-V curve using the I-V data.

Specifically, the high-precise digital source meter 5 is the electronic load of the multi-junction photovoltaic cell, the high-precise digital source meter 5 is connected with the positive and negative electrodes of the multi-junction photovoltaic cell 1 to be detected through the four-wire method which is used to eliminate the voltage test error caused by the series resistances of leads, and the voltage scanning range of the high-precise digital source meter 5 is larger than the voltage scanning range required for testing; the computer 7 is used for controlling the light source and the digital source meter, mainly including sending a voltage scanning instruction to the high-precise digital source meter, sending turning on/off instructions to the light source and collecting the I-V data tested by the high-precise digital source meter, and drawing an I-V curve using the I-V data.

Specifically, the multi-junction photovoltaic cell to be detected can be a multi-junction laser photovoltaic cell or a multi-junction solar cell. When the multi-junction photovoltaic cell 1 to be detected is the multi-junction laser photovoltaic cell, the light source is a power-tunable laser 3 whose power is stable. When the multi-junction laser photovoltaic cell is tested, the head of the output optical fiber 4 should not be too close to the surface of the multi-junction laser photovoltaic cell to avoid the current-limitation of the tunnel junction; when the multi-junction photovoltaic cell 1 to be detected is the multi-junction solar cell, the steady solar simulator is used as the light source.

Specifically, the computer 7 and the high-precise digital source meter 5 as well as the computer 7 and the light source 3 are connected through the serial communication data cable 6, and the high-precise digital source meter 5 is connected with the positive and negative electrodes of the multi-junction photovoltaic cell 1 through wires 2.

Specifically, a measurement method of subcell photocurrents and their matching degree of a multi-junction photovoltaic cell mainly comprises the following steps:

1) providing the detection system of the subcell photocurrents and their matching degree of the multi-junction photovoltaic cell as shown in FIG. 1;

2) attaching the multi-junction photovoltaic cell to a heat sink to ensure that the multi-junction photovoltaic cell has a good heat dissipation condition, and the light irradiation time of the cell should be short enough to reduce the obvious temperature rise of the multi-junction photovoltaic cell during the test;

3) connecting the computer with the high-precise digital source meter using a serial port line;

4) connecting the positive and negative electrodes of the multi-junction photovoltaic cell with the high-precise source meter using the four-wire method;

5) placing the multi-junction photovoltaic cell within the coverage of the light spot;

6) turning on a laser or solar simulator whose power has been set so that the multi-junction photovoltaic cell is stably irradiated, and meanwhile performing voltage scan on the multi-junction photovoltaic cell, so as to obtain the I-V data of the multi-junction photovoltaic cell after voltage scan is completed, wherein the voltage scan starting point in the multi-junction photovoltaic cell I-V testing system is set as the reverse breakdown voltage of the photovoltaic cell, the voltage scan ending point is set as the open-circuit voltage of the multi-junction photovoltaic cell, or the voltage scan starting point is set as the forward open-circuit voltage of the multi-junction photovoltaic cell, and the voltage scan ending point is set as the reverse breakdown voltage of the multi-junction photovoltaic cell;

7) analyzing the current steps in the I-V curve to obtain current values $I_1, I_2, I_3 \ldots I_N$ corresponding to the current steps, respectively, wherein N is the number of junctions of the multi-junction photovoltaic cell, and the current values of the current steps are approximately equal to the short-circuit current values of the subcells;

8) calculating the current mismatching degree M of the multi-junction photovoltaic cell using Formula (1) in combination with the step currents $I_1, I_2, I_3 \ldots I_N$, wherein the smaller the M is, the smaller the current mismatch of the subcells is, conversely, the larger the current mismatch of the subcells is.

Specifically, for the multi-junction laser photovoltaic cell, the corresponding relationship between the short-circuit current of each subcell and each step in the I-V curve is determined by the breakdown voltage of the subcell which is affected by the doping concentration at the low doping side in the PN junction; if the doping concentration at the low doping side of the PN-junction is different, the wider step current corresponds to the short-circuit current of the subcell having a lower doping concentration, and the narrower step current corresponds to the short-circuit current of the subcell having a higher doping concentration.

Specifically, the wavelength of the incident light can be the same as or different from the target wavelength of the multi-junction photovoltaic cell, that is, for the multi-junction laser photovoltaic cell, the wavelength of the incident laser can be a wavelength other than the target wavelength and the current matching degree obtained by the measurement method is aimed at the present wavelength used.

It is noted that the measurement method provided by the embodiment of the present application is mainly directed for the matching degree at the target wavelength of the multi-junction photovoltaic cell, however, the measurement method provided by the embodiment of the present application is also applicable to a wavelength (namely non-target wavelength) other than the target wavelength of the multi-junction photovoltaic cell. This is because in the actual manufacturing process of the cell device, there is deflection between the parameters of the used material and the designed ones, leading to a fact that the optimal response wavelength of the finally manufactured cell device deviates from the target wavelength, at this moment, the subcell photocurrents of the multi-junction photovoltaic cell under the target wavelength are not matched.

Specifically, with a multi-junction GaAs laser photovoltaic cell as an example, the ideal multi-junction GaAs laser photovoltaic cell only has the optimal response to a laser having a single wavelength (target wavelength). For example, the multi-junction GaAs laser photovoltaic cell has the maximum short-circuit current under the irradiation of 808 nm laser, and has the diminished short-circuit current under the irradiation of 830 nm laser. However, the actually manufactured laser photovoltaic cell unnecessarily has the optimal response under the 808 nm.

Specifically, the detection process should be performed in a dark chamber in order to reduce the interference of environmental light. Moreover, the temperature of the environment should be recorded since the current matching degree of the subcells is related to the temperature. The bandgap of the material will narrow at higher temperature, which leads to the increase of the absorption coefficient of the material, hence the change of the current matching degree.

In all, at any temperatures and wavelengths, the subcell photocurrents and their matching degree of the multi-junction photovoltaic cell can be obtained by the measurement method provided by the embodiment of the present application.

Example 1

Figure 2:
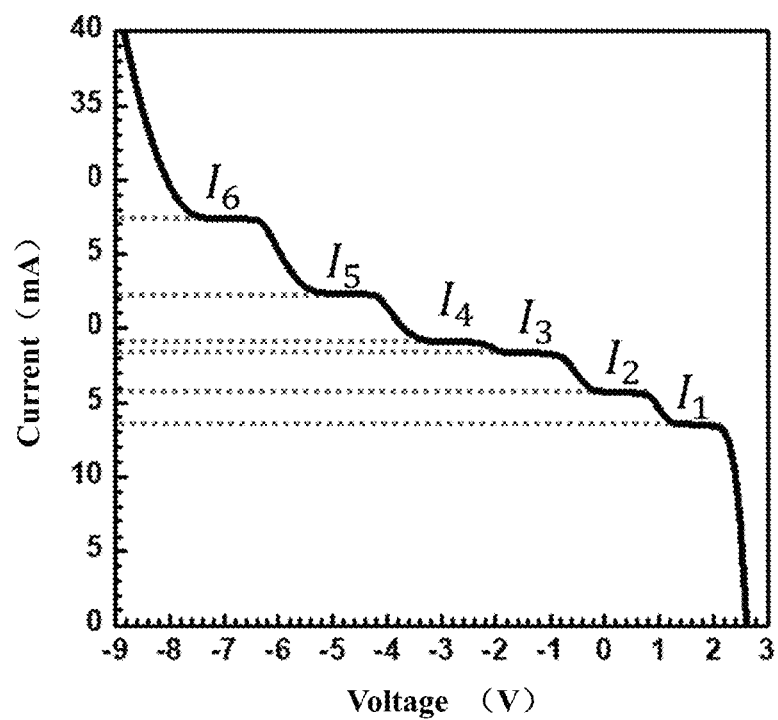
FIG. 2 is an I-V curve of a six-junction 1550 nm InGaAs laser photovoltaic cell in example 1 of the present application.

The measurement method of the subcell photocurrents and their matching degree of the multi-junction photovoltaic cell will be described by using a six-junction 1550 nm InGaAs laser photovoltaic cell as an example. A measurement method of the subcell photocurrents and their matching degree of a multi-junction photovoltaic cell comprises the following steps:

1) roughly detecting the forward I-V characteristics of the photovoltaic cell, selecting an InGaAs laser photovoltaic cell with a small series resistance and no serious leakage, and adhering the InGaAs laser photovoltaic cell (chip) 1 to a ceramic copper-plated heat sink with conductive silver pasted in between, and bonding gold leads for the cell using a lead machine;

2) connecting the InGaAs laser photovoltaic cell with the high-precise digital source meter 5 using the four-wire method, wherein the positive electrode of the InGaAs laser photovoltaic cell 1 is connected with the positive electrode wiring port of the high-precise digital source meter, and the negative electrode is connected with the negative electrode wiring port of the high-precise digital source meter 5, and the working mode of the high-precise digital source meter 5 is set to 'Four Wires';

3) fixing the head of the output optical fiber 4 of the laser 3 above the InGaAs laser photovoltaic cell 1 by using a holder, wherein the head of the optical fiber 4 should be properly distanced from the surface of the InGaAs laser photovoltaic cell (3 cm height is adopted in this example) in order to prevent the current limitation of the tunnel junction due to too large local photocurrent density caused by too large local light intensity;

4) opening the rapid I-V testing program of the multi-junction tandem photovoltaic cell on the computer 7. Since the reverse breakdown voltage of the single-junction InGaAs cell is about −1.5 V, and whose doping concentration is the same as each subcell in the multi-junction cell, the six-junction InGaAs laser photovoltaic cell has a reverse breakdown voltage of about −9 V and an open-circuit voltage of approximate 3 V, the voltage scan starting point is set as −9 V, and the voltage scan ending point is set as 3 V; or the voltage scan starting point is set as 3V, and the voltage scan ending point is set as −9 V; and 5) performing the voltage scan on the InGaAs laser photovoltaic cell to obtain the I-V curve, which is shown in FIG. 2, wherein it can be seen that several current steps whose currents are stable and unchanged when being varied with the voltage occur within the scanned voltage range and the several steps approximately correspond to the photocurrents of subcells, measuring the step currents as "$I_1$", "$I_2$", "$I_3$", "$I_4$", "$I_5$" and "$I_6$", calculating the mismatching degree M of them, and evaluating the current match of the multi-junction photovoltaic cell using the mismatching degree M. The smaller the M is, the smaller the current mismatch of the subcells is, conversely, the larger the current mismatch of the subcells is.

Based on the principle that the higher the doping concentration at the light doping side of the subcell PN junction is, the smaller the width of the current step is, the corresponding relationships between the steps occurring in the I-V curve and the subcells are obtained.

It is noted that the above example is only a preferred application example of the present application, and the protective scope of the present application is not limited. The method for detecting the current matching degree of the subcells utilizing the I-V characteristics provided by the present application can be applied to not only the multi-junction laser photovoltaic cell but also the multi-junction solar cell.

According to the measurement method provided by the embodiment of the present application, the current mismatching degree of the multi-junction photovoltaic cell are obtained by measuring the I-V curve from the reverse bias voltage to the forward bias voltage or from the forward bias voltage to the reverse bias voltage and calculating the mismatching degree using all the step currents occurring in the I-V curve.

The measurement method provided by the embodiment of the present application is rapid and simple, which avoids the complicated and time-consuming processes where the subcell photocurrents are calculated based on the standard light source spectrum integral with bias lights applied; the measurement method provided by the embodiment of the present application is applicable to the extraction of the short-circuit current value of each subcell and the quantitative evaluation of the current match of the multi-junction photovoltaic cell under the irradiation of the light source.

It should be understood that the above example is only for illustrating the technical concept and features of the present application for the purpose of allowing those skilled in the art to know the contents of the present application and implement the present application, and cannot limit the protective scope of the present application. Equivalent variations or modifications made according to the spirit of the present application are all included within the protective scope of the present application.

What is claimed is:

1. A measurement method of subcell photocurrents and a matching degree of the subcell photocurrents of a multi junction photovoltaic cell, comprising:
    measuring an I-V characteristic of the multi-junction photovoltaic cell to obtain an I-V curve of the multi-junction photovoltaic cell; and
    measuring currents corresponding to respective current steps in the I-V curve to obtain approximate values of short-circuit currents of subcells in the multi-junction photovoltaic cell, and then calculating a mismatching degree of the currents to obtain a current mismatching degree of the multi junction photovoltaic cell,
    wherein the measuring currents comprises measuring the respective current steps in the I-V curve to obtain current values $I_1, I_2, I_3 \ldots I_N$, wherein N is a number of junctions of the multi-junction photovoltaic cell, and the current values corresponding to the respective current steps are equal to the approximate values of the short-circuit currents of the subcells respectively, and
    wherein the calculating comprises calculating a current mismatching degree M in combination with the current values $I_1, I_2, I_3 \ldots I_N$ utilizing a Formula (1):

$$M = \frac{\sqrt{\frac{1}{N}\sum_{i=1}^{N}(I_i - \overline{I})^2}}{\overline{I}}; \qquad \text{Formula (1)}$$

wherein, $$\overline{I} = \frac{1}{N}\sum_{i=1}^{N} I_i,$$

the current mismatching degree of the multi junction photovoltaic cell is obtained, wherein when an M value is smaller, a current mismatch of a subcell is smaller or when the M value is larger, the current mismatch of the subcell is larger.

2. The measurement method according to claim 1, comprising irradiating the multi-junction photovoltaic cell using a light source having a stable output power and meanwhile scanning the multi-junction photovoltaic cell within a set voltage scanning range to obtain the I-V curve.

3. The measurement method according claim 2, wherein the set voltage scanning range is from a reverse bias voltage to a forward bias voltage.

4. The measurement method according to claim 3, wherein the set voltage scanning range is from a reverse breakdown voltage to a forward open-circuit voltage of the multi junction photovoltaic cell.

5. The measurement method according to claim 4, specifically comprising
connecting positive and negative electrodes of the multi junction photovoltaic cell with a high-precise source meter using a four-wire method;
placing the multi junction photovoltaic cell within a coverage of a light spot; and
setting and turning on the light source and meanwhile scanning the multi junction photovoltaic cell from the reverse bias voltage to the forward bias voltage to obtain the I-V curve.

6. The measurement method according to claim 2, wherein the set voltage scanning range is from a forward bias voltage to a reverse bias voltage.

7. The measurement method according to claim 6, wherein the set voltage scanning range is from a forward open-circuit voltage to a reverse breakdown voltage of the multi junction photovoltaic cell.

8. The measurement method according to claim 7, specifically comprising
connecting positive and negative electrodes of the multi junction photovoltaic cell with a high-precise source meter using a four-wire method;
placing the multi junction photovoltaic cell within a coverage of a light spot; and
setting and turning on the light source and meanwhile scanning the multi junction photovoltaic cell from the forward bias voltage to the reverse bias voltage to obtain the I-V curve.

9. The measurement method according to claim 1, wherein the multi junction photovoltaic cell comprises an N-junction laser photovoltaic cell, an N-junction solar cell or an N-junction thermal photovoltaic cell, wherein $N \geq 2$.

10. The measurement method according to claim 1, wherein the multi-junction photovoltaic cell is a laser photovoltaic cell, wherein a light source of the laser photovoltaic cell is a laser having stable output power.

11. The measurement method according to claim 1, wherein the multi-junction photovoltaic cell is a multi-junction solar cell, wherein a light source of the multi-junction solar cell is a steady solar simulator.

12. The measurement method according to claim 1, wherein a wavelength of an incident light is identical to or different from a target wavelength of the multi-junction photovoltaic cell.

* * * * *